US008912643B2

(12) United States Patent
de Bock et al.

(10) Patent No.: US 8,912,643 B2
(45) Date of Patent: Dec. 16, 2014

(54) ELECTRONIC DEVICE COOLING WITH MICROJET IMPINGEMENT AND METHOD OF ASSEMBLY

(71) Applicant: General Electric Company, Schenectady, NY (US)

(72) Inventors: Hendrik Pieter Jacobus de Bock, Clifton Park, NY (US); Stanton Earl Weaver, Jr., Broadalbin, NY (US); Raj Bahadur, Schenectady, NY (US); Eric Ayres Browne, Watervliet, NY (US); Gary Dwayne Mandrusiak, Latham, NY (US)

(73) Assignee: General Electric Company, Niskayuna, NY (US)

( * ) Notice: Subject to any disclaimer, the term of this patent is extended or adjusted under 35 U.S.C. 154(b) by 67 days.

(21) Appl. No.: 13/709,469

(22) Filed: Dec. 10, 2012

(65) Prior Publication Data
US 2014/0160677 A1 Jun. 12, 2014

(51) Int. Cl.
*H01L 23/34* (2006.01)
*F28F 13/18* (2006.01)
*H01L 23/473* (2006.01)

(52) U.S. Cl.
CPC .......... *F28F 13/187* (2013.01); *H01L 23/4735* (2013.01)
USPC ................. 257/712; 257/704; 257/E21.499

(58) Field of Classification Search
CPC ......... H01L 21/50; H01L 23/46; F28F 13/187
USPC .................. 257/704, 712, E21.499, E23.088; 438/107, 122, 604; 361/689, 704, 697; 165/104.33, 80.4
See application file for complete search history.

(56) References Cited

U.S. PATENT DOCUMENTS

| 5,083,194 A | 1/1992 | Bartilson |
| 6,267,912 B1 * | 7/2001 | Hershkowitz et al. ........ 252/373 |

(Continued)

FOREIGN PATENT DOCUMENTS

| CN | 1471159 A | 1/2004 |
| EP | 2151863 A1 | 2/2010 |

OTHER PUBLICATIONS

Wang et al., "Micromachined Jets for Liquid Impingement Cooling of VLSI Chips", Microelectromechanical Systems Journal, vol. 13, Issue:5, pp. 833-842, Oct. 2004.

(Continued)

*Primary Examiner* — Cuong Q Nguyen
*Assistant Examiner* — Yosef Gebreyesus
(74) *Attorney, Agent, or Firm* — John P. Darling

(57) ABSTRACT

An integrated circuit device including a die with a substrate with a first surface and a second surface opposite the first surface is provided. The die includes at least one circuit element positioned on the first surface. Formed on the second surface, is a wetting feature that includes an array of spaced-apart nanoscale structures and/or an array of spaced-apart microscale structures. The wetting feature also includes a wettability coating applied to at least a portion of the second surface. The integrated circuit device includes a spacer coupled to the die adjacent to the second surface. In addition, an injector plate is coupled to the spacer. The injector plate includes at least one microjet and at least one exit hole defined through the injector plate. The at least one exit hole is positioned adjacent to the at least one microjet.

20 Claims, 3 Drawing Sheets

(56) References Cited

U.S. PATENT DOCUMENTS

| | | | |
|---|---|---|---|
| 6,781,834 B2 * | 8/2004 | Nair et al. ............... | 361/697 |
| 7,139,172 B2 | 11/2006 | Bezama et al. | |
| 7,188,662 B2 | 3/2007 | Brewer et al. | |
| 7,255,153 B2 | 8/2007 | Berger et al. | |
| 7,432,592 B2 | 10/2008 | Shi et al. | |
| 7,483,770 B2 | 1/2009 | Meinders et al. | |
| 7,516,776 B2 | 4/2009 | Bezama et al. | |
| 7,536,870 B2 | 5/2009 | Bezama et al. | |
| 7,548,421 B2 | 6/2009 | Malone et al. | |
| 7,586,189 B2 * | 9/2009 | Yamauchi et al. ............ | 257/706 |
| 7,802,442 B2 | 9/2010 | Bezama et al. | |
| 7,948,077 B2 | 5/2011 | Andry et al. | |
| 7,987,899 B2 | 8/2011 | Kurtz et al. | |
| 7,992,627 B2 | 8/2011 | Bezama et al. | |
| 2004/0140054 A1 * | 7/2004 | Johnson ............... | 156/345.43 |
| 2007/0043320 A1 * | 2/2007 | Kenany ............... | 604/68 |
| 2008/0060792 A1 | 3/2008 | Berger et al. | |
| 2009/0095444 A1 | 4/2009 | Bezama et al. | |

OTHER PUBLICATIONS

Susan A. Rogers et al., "Annual Progress Report for the Advanced Power Electronicsand Electric Machinery Program", U.S. Department of Energy FreedomCAR and Vehicle Technologies, Nov. 2005.

Qiu, Yu-Hao, et al., Nucleate Boiling on the Superhydrophilic Surface with a Small Water Impingement Jet, International Journal of Heat and Mass Transfer, 2008, pp. 1683-1690, vol. 51, Science Direct, Elsevier.

Marconnet, Amy M., et al., Nanoscale Conformable Coatings for Enhanced thermal Conduction of Carbon Nanotube Films, 5 pages, Department of Mechanical Engineering, Standford University, Priva Tran.

Natarajan, Govindarajan, et al., Microjet Cooler with Distributed Returns, Heat Transfer Engineering, 2007, pp. 779-787, vol. 28(8-9), Taylor and Francis Group, LLC.

Hsu, Chin-Chi, et al., Surface Wettability Effects on Critical Heat Flux of Boiling Heat Transfer Using Nanoparticle Coatings, International Journal of Heat and Mas Transfer, 2012, pp. 3713-3719, vol. 55, Elsevier.

Guo, D., et al., Enhanced Flow Boiling Heat Transfer with Jet Impingement on Micro-Pin-Finned Surfaces, Applied Thermal Engineering, 2011, pp. 2042-2051, vol. 31, Elsevier.

El-Genk, Mohamed S., et al., Subcooled Boiling of PF-5060 Dielectric Liquid on Microporous Surfaces, Journal of Heat Transfer, 2011, pp. 081503-1-081503-8, vol. 133, Transactions of the ASME.

Sung, Myung Ki, et al., Effects of Jet Pattern on Single-Phase Cooling Performance of Hybrid Micro-channel/Micro-Circular-Jet-Impingement Thermal Management Scheme, International Journal of Heat and Mass Transfer, 2008, pp. 4614-4627, vol. 51, Science Direct, Elsevier.

Chien, Liang-Han, et al., An Experimental Study of Two-Phase Multiple Jet Cooling on Finned surfaces Using a Dielectric Fluid, Applied Thermal Engineering, 2011, pp. 1983-1993, vol. 31, Elsevier.

Rogacs, Anita, et al., Characterization of the Wettability of Thin Nanostructured Films in the Presence of Evaporation, Journal of Colloid and Interface Science, 2010, pp. 354-360, vol. 349, Elsevier.

Browne, Eric A., Microjet Array Single-Phase and Flow Boiling Heat Transfer with R134a, International Journal of Heat and Mass Transfer, 2010, pp. 5027-5034, vol. 53, Elsevier.

Bhunia, Avijit, et al., Liquid Micro-Jet Array Impingement Boiling on a Micro-Structured Surface, international Journal of Micro-Nano Scale Transport, 2010, pp. 335-349.

* cited by examiner

ELECTRONIC DEVICE COOLING WITH MICROJET IMPINGEMENT AND METHOD OF ASSEMBLY

BACKGROUND

The subject matter disclosed herein relates generally to cooling electronic devices and, more particularly, to methods and apparatus for dissipating heat from an integrated circuit device.

In at least some known electronic systems, e.g., computers, radios, radar modules, etc., the electronic device is the warmest component in the system. As such, at least some known electronic devices are coupled to a heat removal system to dissipate heat generated by the electronic device. Many known heat removal systems for such electronic devices include a path for heat flow with a high thermal resistance resulting in a high operating junction temperature. Generally, waste heat is removed by conduction, spreading, and convection to an appropriate cooling fluid with gradual reductions in temperature as the heat moves from the heat source to the cooling fluid. For example, the heat generated by a high-density power integrated circuit ("IC") device may travel from the front side of the IC device trough the IC substrate, a thermal interface material, a heat spreader, and a heat sink before being transferred to a cooling fluid, e.g., air.

While considerable efforts have been made to develop heat removal systems that are reliable and efficient, these systems often only address the backside cooling of the electrical devices. These systems are unable to limit the temperature rise of today's complex electronic components. Such cooling solutions, where heat must be conducted away from components before rejection to the air, add considerable weight and volume to electronic systems. This results in complex electronic systems that continue to grow in size and weight due to the inefficiencies of the current cooling system designs.

BRIEF DESCRIPTION

In one aspect, an integrated circuit device is provided. The integrated circuit device includes a die with a substrate that includes a first surface and a second surface opposite the first surface. The die includes at least one circuit element positioned on the first surface. The second surface includes a wetting feature formed on the surface that includes an array of spaced-apart nanoscale structures and/or an array of spaced-apart microscale structures. The wetting feature also includes a wettability coating applied to at least a portion of the second surface. The integrated circuit device also includes a spacer coupled to the die adjacent to the second surface. In addition, an injector plate is coupled to the spacer. The injector plate includes at least one microjet and at least one exit hole defined through the injector plate. The at least one exit hole is positioned adjacent to the at least one microjet.

In another aspect, a cooling system for an integrated circuit device is provided. The cooling system includes a substrate having a surface with a wetting feature formed on the surface. The wetting feature includes an array of spaced-apart nanoscale structures and/or an array of spaced-apart microscale structures. The wetting feature also includes a wettability coating applied to at least a portion of the second surface. The cooling system also includes a spacer coupled to the substrate adjacent to the surface. In addition, an injector plate is also coupled to the spacer. The injector plate includes at least one microjet defined through the injector plate, and at least one exit hole also defined through the injector plate. The at least one exit hole is positioned adjacent to the at least one microjet. In addition, the cooling system includes a flow channel plate coupled to the injector plate. The flow channel plate includes at least one inlet channel coupled in flow communication with the at least one microjet. The cooling system also has a manifold baseplate coupled to the flow channel plate. The manifold baseplate includes an inlet reservoir coupled in flow communication with the at least one inlet channel.

In another aspect, a method includes providing a die with a substrate having a surface. The method also includes forming a wetting feature on the surface of the substrate. The method includes depositing at least one of an array of spaced-apart nanoscale structures and an array of spaced-apart microscale structures onto the surface. In addition, the method includes applying a wettability coating to at least a portion of the surface of the substrate. The method further includes coupling a spacer to the die adjacent the surface. The method includes coupling an injector plate to the spacer. The injector plate includes at least one microjet and at least one exit hole defined through the injector plate. The at least one exit hole is positioned adjacent the at least one microjet.

DRAWINGS

Although specific features of various embodiments may be shown in some drawings and not in others, this is for convenience only. Any feature of any drawing may be referenced and/or claimed in combination with any feature of any other drawing.

DETAILED DESCRIPTION

The apparatus, systems, and methods described herein relate to cooling integrated circuit (IC) devices. An intrachip micro-channel impingement cooler (MCIC) includes bringing microfluidic evaporative liquid cooling within about 100 micrometers (μm) of the heat source using micro-channel impingement cooling. In operation, a subcooled liquid, or cooling fluid, enters a reservoir that feeds channels configured to carry the cooling fluid to an array of microjets, which are etched into an injector plate that is offset a defined distance from the integrated circuit device. The high velocity liquid exiting from the microjets impinges on the heated surface of the die, where it provides cooling through both single-phase convection and boiling heat transfer. Nanoscale and microscale structures formed on the surface of the die substrate enhance nucleate boiling, heat transfer coefficient, and increase critical heat flux (CHF) to levels above those measured for an equivalent smooth surface. The vapor produced during boiling vents through exit holes aligned with each microjet array and travels through a low pressure drop channel to an exit reservoir and external condenser. Venting the vapor proximate to where it is produced facilitates eliminating downstream interference from vapor produced upstream and facilitates reducing the pressure drop for the cooling system. Such efficient venting may also increase CHF by providing a low-resistance path for the vapor to leave the surface at the location where the vapor is being produced. Furthermore, to facilitate reducing the size of local hot spots and spreading the heat across the die, the die may be fabricated with a diamond-chip substrate.

In the exemplary embodiment, R-134a (also known as 1,1,1,2-Tetrafluoroethane) is used as the cooling fluid. R-134a is an effective cooling fluid due to its low surface tension and low boiling temperature. In other embodiments, water, a mixture of ethylene-glycol and water, or a mixture of propylene-glycol and water may be used. In an alternative embodiment, a dielectric fluid may be used.

Figure 1:
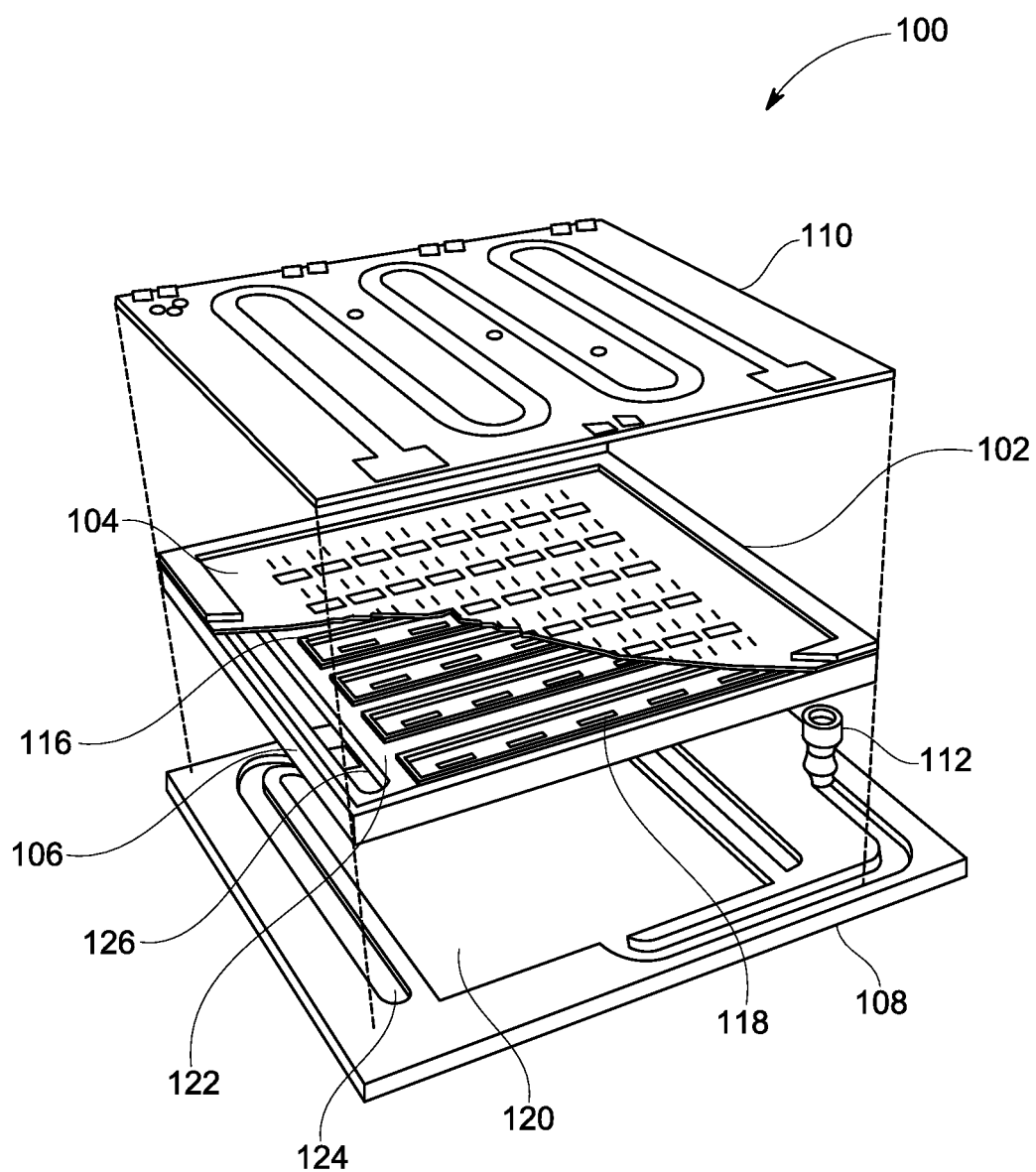
FIG. 1 is a schematic in perspective view of an exemplary integrated circuit device including an intrachip micro-channel impingement cooler.

FIG. 1 illustrates a perspective view of an exemplary integrated circuit device 100 including the intrachip MCIC. Integrated circuit device 100 includes a die 110 (also known as an IC die), which includes backside surface texturing and surface wettability modifications (see FIG. 3), a spacer 102, an injector plate 104, a flow channel plate 106, and a manifold baseplate 108. Manifold baseplate 108 further includes a fluid inlet port 112 and a fluid outlet port (not shown). The components of integrated circuit device 100 are connected in a hermetically-sealed cooling circuit. As used herein, the term "die" or "IC die" refers to an object that affects electrons or their associated fields and generates heat as a byproduct of its operation. Examples of IC dies include, but are not limited to, semiconductors, microprocessors, digital signal processors, graphics processing units, diodes, transistors, or any other suitable heat-generating devices. In the exemplary embodiment, die 110 is a die heater circuit formed on a diamond-chip substrate to facilitate reducing local hot spots on die 110. Alternatively, die 110 may be any object that enables integrated circuit device 100 to function as described herein.

In the exemplary embodiment, a single die 110 is coupled to spacer 102 to form integrated circuit device 100. Any quantity of dies 110 that enables integrated circuit device 100 to function as described herein, however, may be coupled to spacer 102.

As shown in FIG. 1, in the exemplary embodiment, spacer 102 is a rectangular shaped member with an upper surface and a lower surface spaced a defined distance from the upper surface. The periphery, or outside edge, of spacer 102 is adjacent the periphery of die 110. An inside edge is spaced inward from the periphery defining a void in spacer 102. The function of spacer 102 is to offset injector plate 104 offset a defined distance from die 110. In other embodiments, spacer 102 may be any shape with an internal void defined therein than permits spacer 102 to function as described herein.

Die 110 is coupled to spacer 102 where its circuit elements are on the surface opposite spacer 102. In the exemplary embodiment, spacer 102 is coupled to die 110 using any suitable fastening mechanism that enables spacer 102 or die 110 to function as described herein. For example, in the exemplary embodiment, spacer 102 may have its front side surface metalized with a combination of sputtered titanium, nickel, and gold (Ti/Ni/Au). Die 110 may then be soldered to spacer 102 using a eutectic metal alloy, or solder. In the exemplary embodiment, the use of the eutectic metal alloy enables spacer 102 and die 110 to be coupled forming a hermetic seal therebetween. Alternatively, the solder material may include any suitable material or composition that enables spacer 102 and die 110 to function as described herein.

To facilitate mitigating stresses resulting from thermal expansion between spacer 102 and die 110, in the exemplary embodiment, spacer 102 may be fabricated from silicon, a material having a coefficient of thermal expansion (CTE) similar to that of the diamond-chip substrate of die 110. Alternatively, in another embodiment, spacer 102 may be fabricated from copper alloys of molybdenum and tungsten, etc., or any other suitable material or composition that enables spacer 102 and die 110 to function as described herein.

Figure 2:
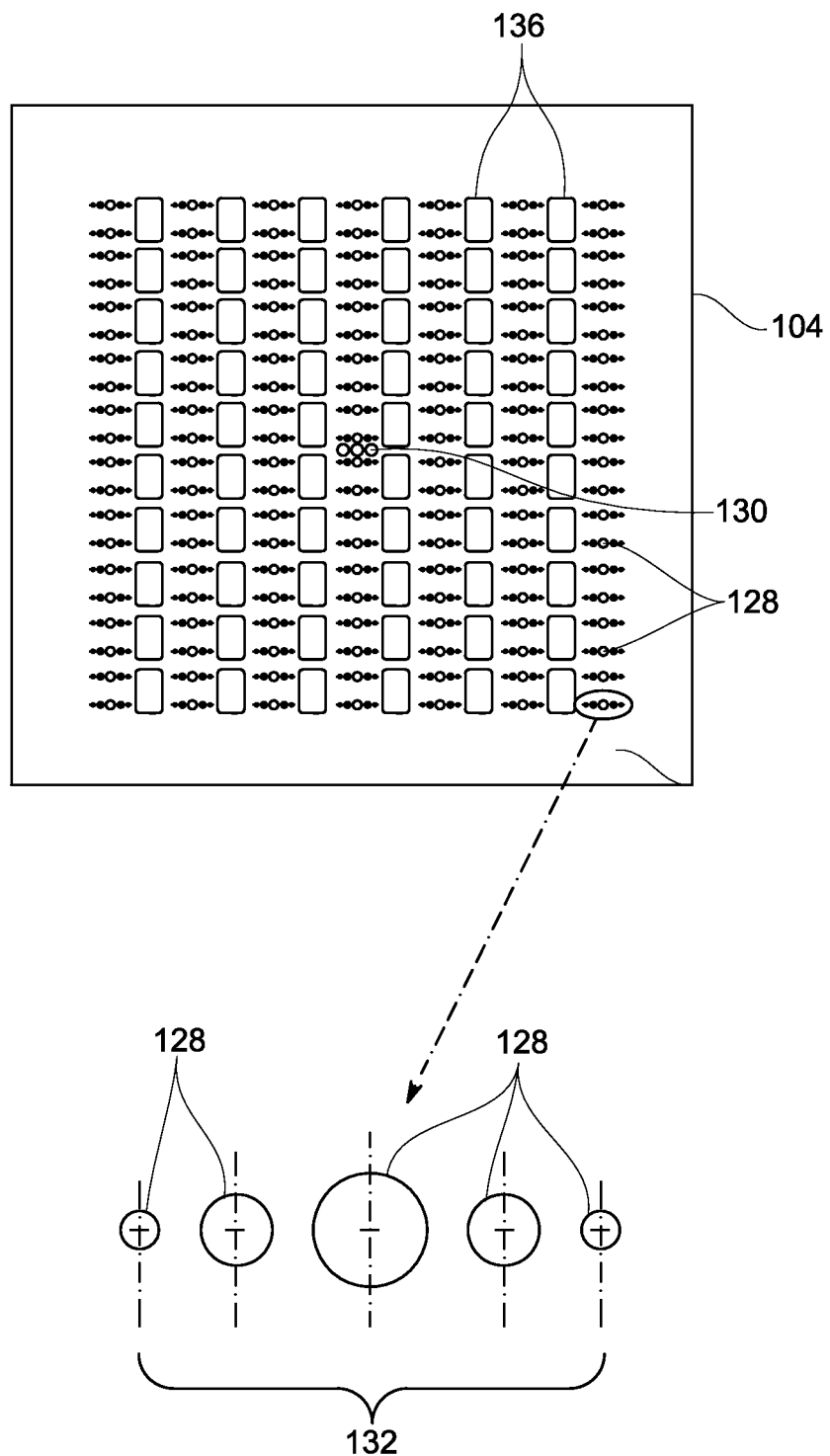
FIG. 2 is a partial schematic in perspective view of the injector plate showing an array of microjets.

FIG. 2 is a partial schematic in perspective view of the injector plate 104 showing microjets 128 defined therethrough. In the exemplary embodiment, the size and arrangement of microjets 128 used in the microjet array is chosen to distribute the cooling fluid along the backside surface 134 of die 110 (see FIG. 3) in a way that increases the CHF and permits nucleate boiling along the backside surface of the die. As shown, local microjet array 132 includes a plurality of microjets 128 generally positioned with their center points aligned. In the exemplary embodiment, microjets 128 decrease in diameter from the center of local microjet array 132 to the outer edges of local microjet array 132. In one embodiment, the diameter of microjets 128 ranges between about 40 µm and about 180 µm. The decreasing diameter of microjets 128 facilitates directing the vapor from the boiling cooling fluid towards exit holes 136. Furthermore, the decreasing diameter of microjets 128 may also increase CHF by enhancing the rate at which the cooling fluid replaces the vapor that exits through exit holes 136. In some embodiments, injector plate 104 may also include supplementary microjets 130 located at various positions corresponding to local hotspots on die 110. The size and location of supplementary microjets 130 is determined by the heat flux removal requirements of the local hotspot.

As shown in FIG. 2, injector plate 104 includes an exit hole 136 adjacent each local microjet array 132. In the exemplary embodiment, exit hole 136 is a rectangular-shaped hole adjacent a plurality of microjet arrays 132. In other embodiments, however, exit hole 136 may be any shape or size that facilitates the increasing the heat transfer characteristics of the intrachip MCIC. Removing the vapor proximate to where it is produced facilitates eliminating downstream interference from vapor produced upstream and facilitates reducing the pressure drop for the cooling system. Furthermore, such efficient venting may also increase CHF by providing a low-resistance path for the vapor to leave the surface at the location where the vapor is being produced.

Referring back to FIG. 1, in the exemplary embodiment, injector plate 104 is coupled to spacer 102 using any suitable fastening mechanism that enables injector plate 104 and spacer 102 to function as described herein. For example, in the exemplary embodiment, injector plate 104 and spacer 102 are diffusion bonded together using a eutectic metal alloy, or solder, e.g., gold-tin (Au—Sn), that enables spacer 102 and injector plate 104 to be coupled forming a hermetic seal therebetween. In another embodiment, the solder material includes any suitable material or composition that enables injector plate 104 and spacer 102 to function as described herein.

To facilitate mitigating stresses resulting from thermal expansion between spacer 102 and injector plate 104, in the exemplary embodiment, injector plate 104 may be fabricated from silicon to match the CTE of spacer 102. Alternatively, in another embodiment, spacer 102 may be fabricated from any suitable material or composition, such as copper alloys of molybdenum and tungsten, that enables spacer 102 and injector plate 104 to function as described herein.

As shown in FIG. 1, integrated circuit device 100 includes flow channel plate 106. Flow channel plate 106 includes a plurality of cooling fluid inlet channels 116 formed in the top surface of flow channel plate 106. Inlet channels 116 are configured to channel the cooling fluid to the microjets 128. Each of the inlet channels 116 includes a plurality of fluid inlets 118 for circulating the cooling fluid from the inlet reservoir 120 to the microjets 128. Flow channel plate 106 also includes a plurality of outlet channels 122 formed in the top surface of flow channel plate 106. Outlet channels 122 are configured to channel the vapor of the cooling fluid exiting through the exit holes 136 of injector plate 104 to outlet reservoir 124 through fluid outlets 126.

In the exemplary embodiment, flow channel plate 106 is coupled to injector plate 104 using any suitable fastening mechanism that enables flow channel plate 106 and injector plate 104 to function as described herein. For example, in the exemplary embodiment, flow channel plate 106 and injector plate 104 are then diffusion bonded together using a eutectic metal alloy, or solder, e.g., Au—Sn, that enables flow channel plate 106 and injector plate 104 to be coupled together forming a hermetic seal therebetween. In another embodiment, the solder material includes any suitable material or composition that enables flow channel plate 106 and injector plate 104 to function as described herein.

To facilitate mitigating stresses resulting from thermal expansion between flow channel plate 106 and injector plate 104, in the exemplary embodiment, flow channel plate 106 may be fabricated from silicon to match the CTE of injector plate 104. Alternatively, in another embodiment, flow channel plate 106 may be fabricated from any suitable material or composition that enables flow channel plate 106 and injector plate 104 to function as described herein.

Furthermore, as shown in FIG. 1, the exemplary embodiment includes manifold baseplate 108. Manifold baseplate 108 includes inlet reservoir 120 and outlet reservoir 124. In one embodiment, inlet port 112 and the outlet port (not shown) are defined within manifold baseplate 108. Inlet port 112 and the outlet port are coupled in flow communication to a condenser (not shown) configured for condensing the exiting vapor of the cooling fluid into a liquid. In addition, integrated circuit device 100 includes a pump apparatus for circulating the cooling fluid back into the intrachip MCIC. In one embodiment, inlet port 112 includes an inlet check valve that allows the cooling fluid circulating from the pump apparatus to enter inlet reservoir 120 but does not allow the cooling fluid to exit inlet reservoir 120 through the inlet check valve. In one embodiment, the outlet port (not shown) may also include an outlet check valve that allows the cooling fluid vapor circulating from the intrachip MCIC to exit the outlet reservoir but does not allow the cooling fluid to reverse flow and enter the outlet reservoir 124 through the outlet check valve.

In the exemplary embodiment, manifold baseplate 108 is coupled to flow channel plate 106. Manifold baseplate 108 and flow channel plate 106 are coupled together using any suitable fastening mechanism that enables flow manifold baseplate 108 and flow channel plate 106 to function as described herein. For example, in the exemplary embodiment, the backside surface of flow channel plate 106 may be metalized with a combination of sputtered Ti/Ni/Au. Manifold baseplate 108 and flow channel plate 106 are then bonded together using a eutectic metal alloy, or solder, that enables manifold baseplate 108 and flow channel plate 106 to be coupled together forming a hermetic seal therebetween. In alternative embodiments, the solder material includes any suitable material or composition that enables manifold baseplate 108 and flow channel plate 106 to function as described herein.

In one embodiment, manifold baseplate 108 is fabricated from copper/nickel/tungsten (CuNiW) material to match substantially the CTE of flow channel plate 106. This facilitates mitigating stresses resulting from thermal expansion between manifold baseplate 108 and flow channel plate 106. In alternative embodiments, manifold baseplate 108 may be fabricated from any suitable material or composition, e.g., nickel-iron (NiFe), that enables manifold baseplate 108 and flow channel plate 106 to function as described herein.

Figure 3:
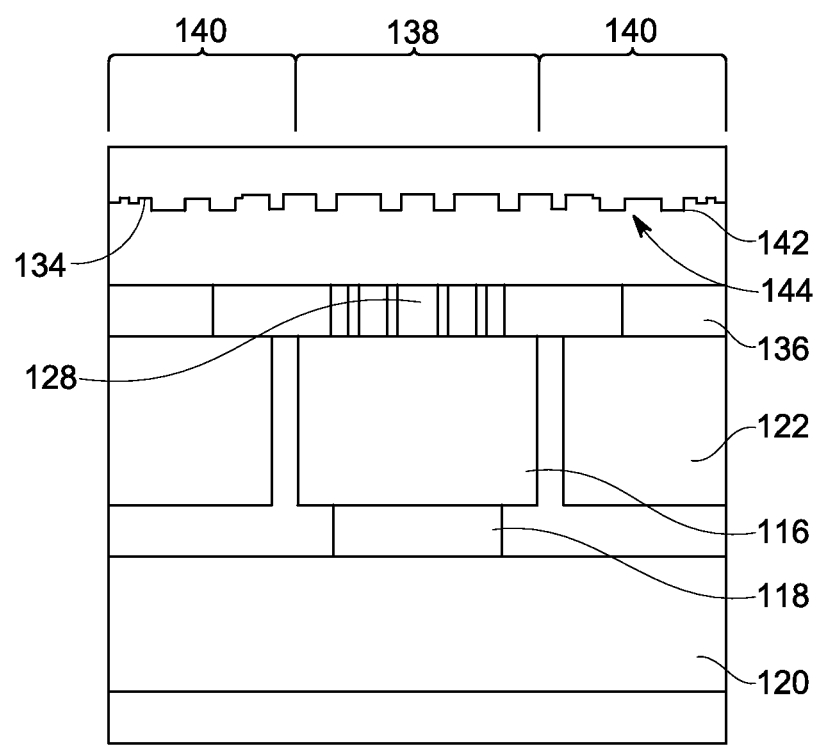
FIG. 3 is a section view of the integrated circuit device 100 illustrating the local surface modifications for enhancing single and two-phase heat transfer.

FIG. 3 is a section view of the integrated circuit device 100 illustrating the local surface modifications for enhancing single and two-phase heat transfer. A high heat transfer coefficient is reached where the thermal boundary layer tends toward zero thickness. The high momentum region below microjets 128 allows for a high heat transfer coefficient because the thermal boundary layer is at a minimal thickness. A subcooled cooling fluid jet impinging on backside surface 134 has a distinct single-phase region where convection, or sensible heat transfer, dominates heat rejection, and a two-phase region where nucleation occurs and latent heat absorption dominates heat rejection. To facilitate enhancing single and two-phase heat transfer from the backside surface 134, in the exemplary embodiment, die 110 includes local surface modifications, or wetting features, to its backside surface 134.

As shown in FIG. 3, in the exemplary embodiment, backside surface 134 includes a subcooled convection region 138 and a convective boiling region 140. In the exemplary embodiment, subcooled convection region 138 includes features that increase the surface area and heat transfer coefficient of subcooled convection region 138. In one embodiment, subcooled convection region 138 includes nanoscale or microscale structures 142 formed on backside surface 134, e.g., nanospring array patterned channels, for increasing the surface area and heat transfer coefficient of subcooled convection region 138. In alternative embodiments, however, subcooled convection region 138 may include any surface texturing and surface wettability modifications that enables subcooled convection region 138 to function as described herein.

As used herein, the term "nanoscale" generally refers to structures of a size measurable in nanometers. Additionally, as used herein, the term "microscale" generally refers to structures of a size measurable in micrometers. The nanoscale and microscale structures 142 in subcooled convection region 138 may be formed using plasma etching techniques, or by using any other etching or deposition technique that permits the nanoscale and microscale structures to be formed as described herein.

Also shown in FIG. 3, backside surface 134 includes a convective boiling region 140. In the exemplary embodiment, convective boiling region 140 includes surface wetting features, e.g., coatings 144 that alter the wetting characteristics of surface 134 (wettability coatings), applied to backside surface 134. The surface wetting features are configured to improve wetting of backside surface 134 to enhance nucleation, reduce the wall superheat value, and to enhance the critical heat flux in convective boiling region 140. In alternative embodiments, convective boiling region 140 may include any surface wettability modifications that enables convective boiling region 140 to function as described herein. The surface wetting features and coatings 144 applied to convective boiling region 140 may be applied using any deposition technique that permits the surface wetting features and coatings to be formed as described herein.

In an exemplary embodiment, a method of assembling integrated circuit device 100 includes forming a wetting feature on backside surface 134 of die 110. The wetting feature may be formed by forming at least one of an array of spaced-apart nanoscale or spaced-apart microscale structures 142 on a portion of backside surface 134, and by applying a wettability coating 144 to at least a portion of backside surface 134. In one embodiment, the array of space-apart nanoscale structures 144 includes nanospring array patterned channels. In other embodiments, the wetting feature may include any surface texturing or surface wettability modifications that enable the forming of a wetting feature on backside surface 134 to function as described herein.

As described above, the method includes coupling die 110, spacer 102, and injector plate 104 to each other. In one embodiment, flow channel plate 106 is coupled to injector plate 104 and manifold baseplate 108 is coupled to flow channel plate 106 in such a way as to form a hermetically-sealed cooling circuit. In another embodiment, a condenser may be coupled in flow communication with integrated circuit device 100. In an additional embodiment, integrated circuit device 100 includes a pump apparatus coupled in flow communication with manifold baseplate 108.

Exemplary embodiments of cooling integrated circuit devices are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

As used herein, an element or step recited in the singular and preceded with the word "a" or "an" should be understood as not excluding plural said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit device, comprising:
    a die having a substrate including a first surface and a second surface opposite said first surface, said die including at least one circuit element positioned on said first surface, said second surface including a wetting feature comprising:
        at least one of an array of spaced-apart nanoscale structures and an array of spaced-apart microscale structures formed on at least a portion of said second surface; and
        a wettability coating covering at least a portion of said second surface;
    a spacer coupled to said die adjacent said second surface; and
    an injector plate coupled to said spacer, said injector plate comprising:
        at least one microjet defined therethrough; and
        at least one exit hole defined therethrough, wherein said at least one exit hole is adjacent said at least one microjet.

2. The integrated circuit device in accordance with claim 1, wherein said at least one microjet is positioned opposite said at least one circuit element positioned on said first surface.

3. The integrated circuit device in accordance with claim 1, wherein said injector plate further comprises an array of said at least one microjet and an array of said at least one exit hole.

4. The integrated circuit device in accordance with claim 1, wherein said wettability coating comprises at least one of a metallic compound and a ceramic compound.

5. The integrated circuit device in accordance with claim 1, wherein said spaced-apart nanoscale structures further comprises an array of nanospring patterned channels.

6. The integrated circuit device in accordance with claim 1, further comprising a flow channel plate coupled to said injector plate, said flow channel plate including at least one inlet channel coupled in flow communication with said at least one microjet and at least one outlet channel coupled in flow communication with said at least one exit hole.

7. The integrated circuit device in accordance with claim 6, further comprising a manifold baseplate coupled to said flow channel plate, said manifold baseplate including an inlet reservoir coupled in flow communication with said at least one inlet channel and an outlet reservoir coupled in flow communication with said at least one outlet channel.

8. The integrated circuit device in accordance with claim 7, wherein said die, said spacer, said injector plate, said flow channel plate, and said manifold baseplate are coupled in a hermetically sealed fluid circulation path.

9. A cooling system for an integrated circuit device, said cooling system comprising:
    a substrate having a surface with a wetting feature comprising:
        at least one of an array of spaced-apart nanoscale structures and an array of spaced-apart microscale structures formed on at least a portion of said surface; and
        a wettability coating covering at least a portion of said surface;
    a spacer coupled to said substrate adjacent said surface;
    an injector plate coupled to said spacer, said injector plate comprising:
        at least one microjet defined therethrough; and
        at least one exit hole defined therethrough, wherein said at least one exit hole is adjacent said microjet;
    a flow channel plate coupled to said injector plate, said flow channel plate including at least one inlet channel coupled in flow communication with said at least one microjet; and
    a manifold baseplate coupled to said flow channel plate, said manifold baseplate including an inlet reservoir coupled in flow communication with said at least one inlet channel.

10. The cooling system in accordance with claim 9, wherein said substrate, said spacer, said injector plate, said flow channel plate, and said manifold baseplate are coupled in a hermetically sealed fluid circulation path.

11. The cooling system in accordance with claim 9, wherein said injector plate further comprises an array of said at least one microjet.

12. The cooling system in accordance with claim 11, wherein each microjet of said array has a diameter between about 40 micrometers and about 180 micrometers.

13. The cooling system in accordance with claim 9, wherein said wettability coating comprises at least one of a metallic compound and a ceramic compound.

14. The cooling system in accordance with claim 13, wherein said spaced-apart nanoscale structures further comprises an array of nanospring patterned channels.

15. The cooling system in accordance with claim 9, further comprising at least one outlet channel defined within said flow channel plate and coupled in flow communication with said at least one exit hole.

16. The cooling system in accordance with claim 15, further comprising an outlet reservoir defined within said manifold baseplate and coupled in flow communication with said at least one outlet channel.

17. A method comprising:
forming a wetting feature on a surface of a substrate of a die, including:
forming at least one of an array of spaced-apart nanoscale structures and an array of spaced-apart microscale structures on at least a portion of the surface; and
applying a wettability coating to at least a portion of the surface;
coupling a spacer to the die adjacent the surface; and
coupling an injector plate to the spacer, wherein the injector plate includes at least one microjet defined through the injector plate and at least one exit hole defined through the injector plate, wherein the at least one exit hole is positioned adjacent the at least one microjet.

18. The method in accordance with claim 17, wherein applying a wettability coating comprises applying at least one of a metallic compound and a ceramic compound to the at least a portion of the surface.

19. The method in accordance with claim 17, wherein forming at least one of an array of spaced-apart nanoscale structures comprises forming an array of nanospring patterned channels.

20. The method in accordance with claim 17, wherein the injector plate includes an array of the at least one microjet, wherein each microjet of the array has a diameter between about 40 micrometers and about 180 micrometers.

\* \* \* \* \*